(12) United States Patent
Rzepecki et al.

(10) Patent No.: US 10,485,122 B2
(45) Date of Patent: Nov. 19, 2019

(54) ELECTRICALLY INSULATIVE CASE INCLUDING FRAME HAVING PLURALITY OF POSSIBLE ORIENTATIONS

(71) Applicant: ABB Schweiz AG, Baden (CH)

(72) Inventors: Ryszard Rzepecki, Bielsko-Biala (PL);
Tomasz Jan Babik, Roczyny (PL);
Piotr Pawel Honkisz, Kozy (PL);
Rafal Marek Mrotek, Bielsko-Biala (PL)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/799,467

(22) Filed: Oct. 31, 2017

(65) Prior Publication Data

US 2019/0132970 A1    May 2, 2019

(51) Int. Cl.
*H05K 5/02* (2006.01)
*H05K 5/03* (2006.01)
*H01H 19/08* (2006.01)
*H01H 19/14* (2006.01)

(52) U.S. Cl.
CPC ............ *H05K 5/0217* (2013.01); *H05K 5/03* (2013.01); *H01H 19/08* (2013.01); *H01H 19/14* (2013.01); *H05K 5/0226* (2013.01)

(58) Field of Classification Search
CPC ...... H05K 5/0217; H05K 5/03; H05K 5/0226; H01H 19/08; H01H 19/14

USPC .......................................................... 361/724
See application file for complete search history.

(56) References Cited

U.S. PATENT DOCUMENTS

| | | | |
|---|---|---|---|
| 4,728,757 A | 3/1988 | Buxton et al. | |
| 6,005,208 A | 12/1999 | Castonguay | |
| 6,373,004 B1* | 4/2002 | Jackson | H01H 9/287 200/331 |
| 7,871,137 B2* | 1/2011 | Schulz | H02B 1/28 312/296 |
| 7,911,768 B2* | 3/2011 | Ignasiak | H02B 1/28 200/302.1 |
| 9,478,956 B1* | 10/2016 | Elbaz | H02G 3/088 |
| 2005/0082081 A1* | 4/2005 | Marcou | H02G 3/088 174/67 |

* cited by examiner

*Primary Examiner* — Rockshana D Chowdhury
(74) *Attorney, Agent, or Firm* — Barnes & Thornburg LLP

(57) ABSTRACT

An electrically insulative case for an electrical device includes a housing defining an interior space. The electrically insulative case also includes a frame operatively coupleable to the housing in a plurality of orientations. The frame defines at least one opening that provides access to the electrical device. An inner sidewall of the frame extends into the interior space. The electrically insulative case further includes a restrictor coupleable to the electrical device such that the restrictor extends adjacent to the frame. The restrictor is arranged to inhibit objects from moving from an exterior of said housing into the interior space.

21 Claims, 16 Drawing Sheets

ELECTRICALLY INSULATIVE CASE INCLUDING FRAME HAVING PLURALITY OF POSSIBLE ORIENTATIONS

BACKGROUND

The field of the disclosure relates generally to electrically insulative cases for electrical devices and, more particularly, to electrically insulative cases including a frame having a plurality of possible orientations.

At least some known electrical systems include an electrical device that is coupled to a circuit and receives electrical current transmitted through the circuit. Typically, such systems include an electrically insulative case that encloses at least a portion of an electrical device and inhibits current flowing to the exterior of the case. In at least some known electrical systems, the case includes an opening that allows access to an interior of the case. However, objects such as wires and tools are sometimes positioned through the opening and can contact current carrying components of the electrical system. Accordingly, some cases include a frame and/or a cover to restrict access through the opening. However, known frames and covers limit the electrical devices that are accommodated by the case. Moreover, at least some known frames and covers require fasteners and tools to assemble. As a result, the cost and time required to assemble electrical systems including such cases are increased.

BRIEF DESCRIPTION

In one aspect, an electrically insulative case for an electrical device is provided. The electrically insulative case includes a housing defining an interior space. The housing is arranged to receive the electrical device within the interior space. The electrically insulative case also includes a frame operatively coupleable to the housing in a plurality of orientations. The frame defines at least one opening that provides access to the electrical device. The frame includes an inner sidewall that extends into the interior space. The electrically insulative case further includes a restrictor coupleable to the electrical device such that said restrictor extends from the electrical device and along the inner sidewall of the frame. The restrictor is arranged to inhibit objects from moving from an exterior of said housing into the interior space.

In another aspect, an electrical system is provided. The electrical system includes an electrical device and an electrically insulative case for the electrical device. The electrically insulative case includes a housing defining an interior space. The housing is arranged to receive the electrical device within the interior space. The electrically insulative case also includes a frame operatively coupleable to the housing in a plurality of orientations. The frame defines at least one opening that provides access to the electrical device. The frame includes an inner sidewall that extends into the interior space The electrically insulative case further includes a restrictor coupleable to the electrical device such that said restrictor extends from the electrical device and along said inner sidewall of the frame. The restrictor is arranged to inhibit objects from moving from an exterior of the housing into the interior space.

In yet another aspect, a method of manufacturing an electrical system including an electrical device and an electrically insulative case is provided. The method includes positioning the electrical device within an interior space of a housing of the electrically insulative case. The method also includes positioning a frame on the housing such that an inner sidewall of the frame extends into the interior space. The frame defines at least one opening to provide access to the electrical device. The frame is operatively coupleable to the housing in a plurality of orientations. The method further includes coupling the frame to the housing in an orientation that accommodates the electrical device. The at least one opening is aligned with the electrical device. The method also includes coupling a restrictor to the electrical device. The restrictor extends from the electrical device and along the inner sidewall of the frame and inhibits objects from moving from an exterior of said housing into the interior space.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Exemplary embodiments of electrically insulative cases for electrical devices and methods of manufacturing such cases are described herein. The electrically insulative cases generally include a restrictor, a housing, and a frame. The housing is arranged to receive an electrical device within an interior space and defines at least one opening to provide access to the electrical device within the interior space. The electrical device is positionable relative to the housing to facilitate access to the electrical device. The restrictor is coupled to the electrical device and provides a labyrinth path into the interior space to inhibit objects from moving from an exterior of the housing into the interior space. The frame is positionable on the housing in a plurality of orientations. Moreover, in some embodiments, a cover is coupled to the frame and positionable to close the opening. The cover is coupled to the frame in a plurality of configurations for each orientation of the cover. As a result, the case increases the number of electrical devices that are accommodated by the case without changing parts. Furthermore, the case decreases the cost and time required to assemble electrical systems.

Figure 1:
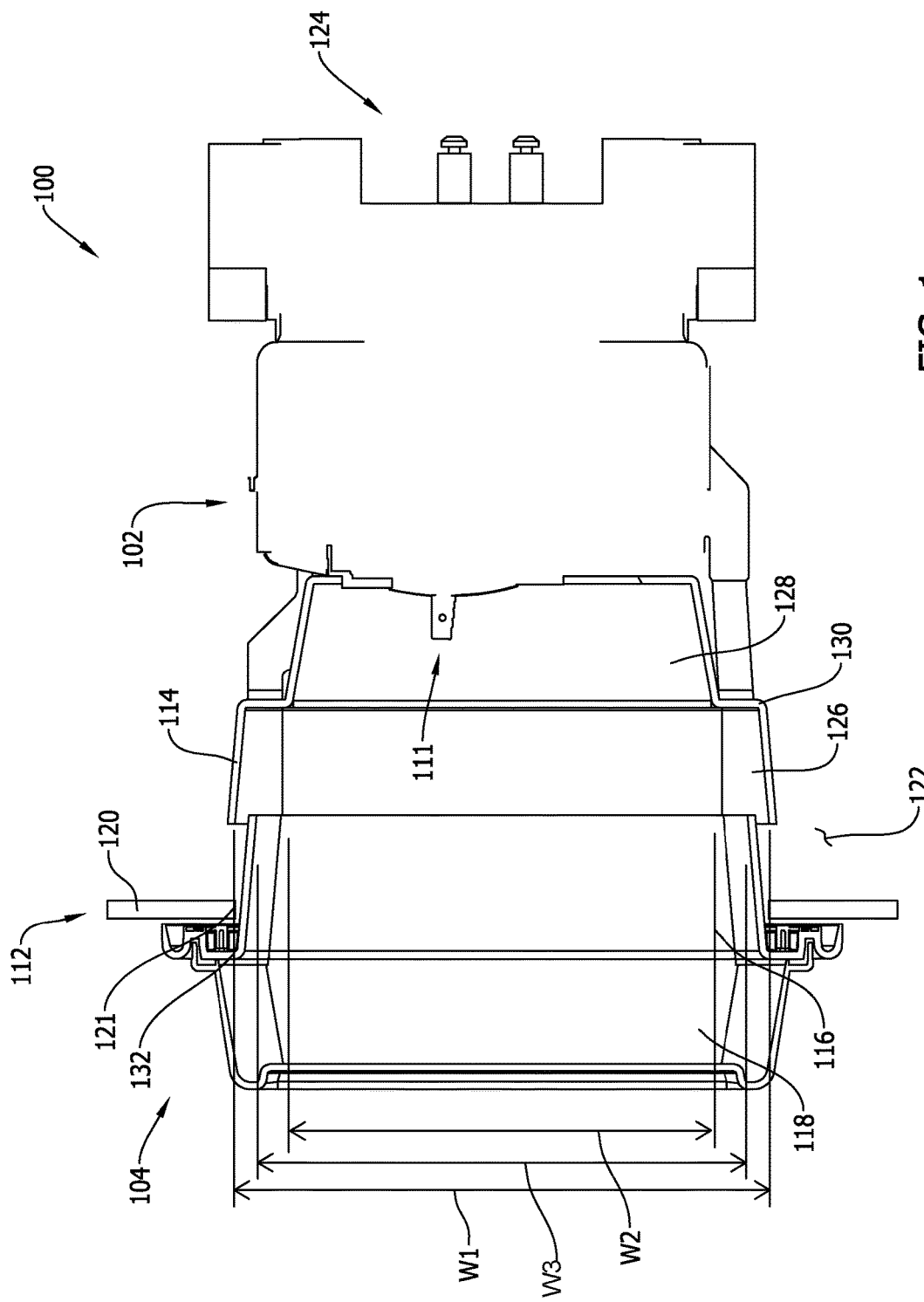
FIG. 1 is a sectional view of a portion of an electrical system including an electrical device and an electrically insulative case in a first position.
Figure 2:
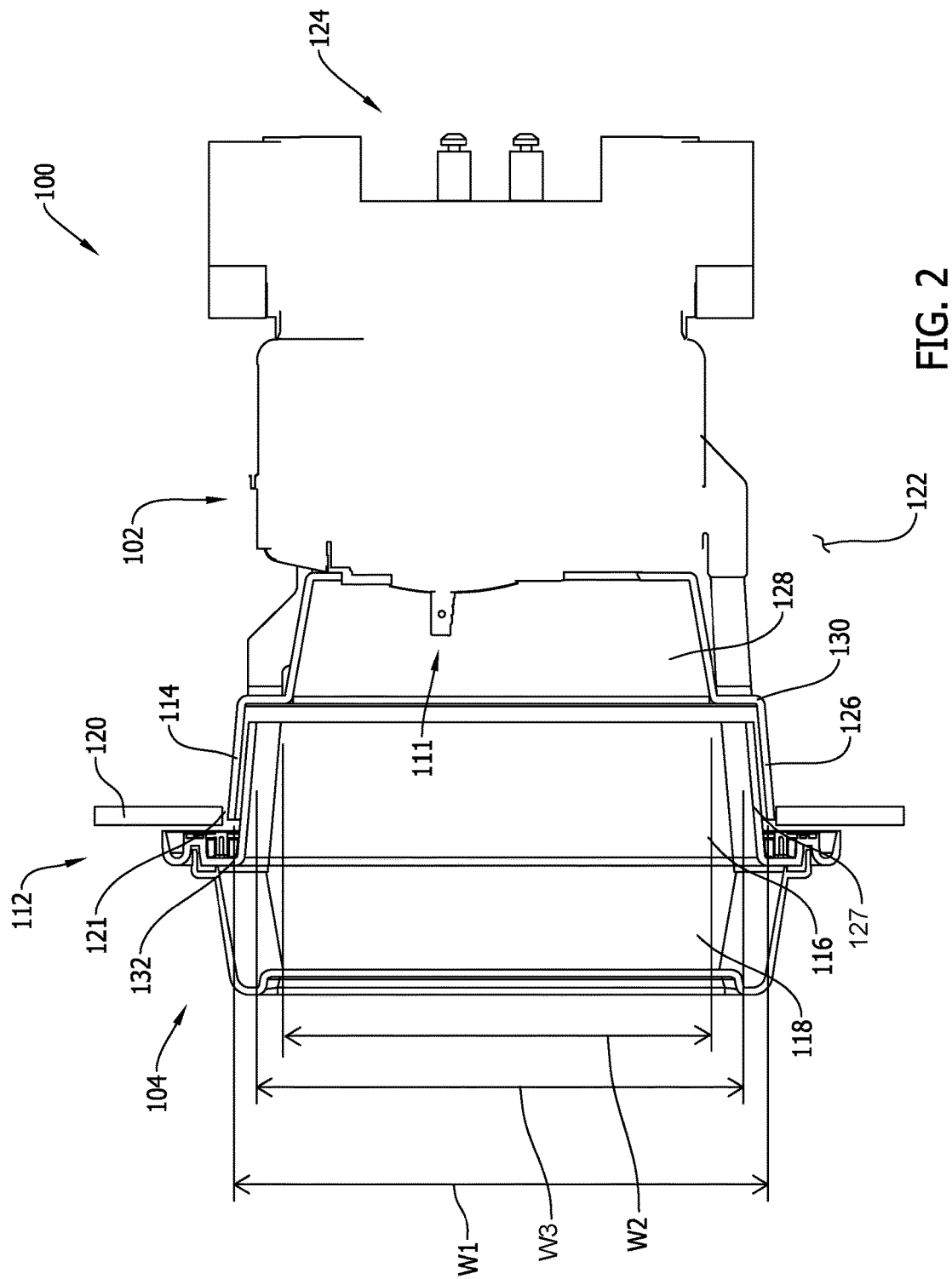
FIG. 2 is a sectional view of a portion of the electrical system shown in FIG. 1, and including the electrical device and the electrically insulative case in a second position.

FIG. 1 is a sectional view of a portion of an electrical system 100 including an electrical device 102 and an electrically insulative case 104 in a first position. FIG. 2 is a sectional view of a portion of electrical system 100 including electrical device 102 and electrically insulative case 104 in a second position. In the exemplary embodiment, electrical device 102 is coupled to a circuit such that electrical device 102 controls flow of electric current through the circuit. Case 104 electrically insulates electrical device 102 such that electrical current is inhibited from passing through case 104 to the surrounding environment. Electrical device 102 includes any components that enable electrical device 102 to operate as described herein. For example, in some embodiments, electrical device 102 includes a load strap, a line strap, a rotor assembly, and an operating mechanism 111. In the exemplary embodiment, electrical device 102 is a circuit breaker. In alternative embodiments, electrical system 100 includes any electrical device 102 that enables electrical system 100 to operate as described herein. For example, in some embodiments, electrical system 100 includes, without limitation, air circuit breakers, molded case circuit breakers, switches, miniature circuit breakers, and/or relays. In addition, in some embodiments, electrical system 100 includes a plurality of electrical devices 102.

In the exemplary embodiment, case 104 includes a housing 112, a restrictor 114, a frame 116, and a cover 118. Housing 112 includes one or more panels 120 defining an interior space 122. Housing 112 is arranged to receive electrical device 102 within interior space 122. In some embodiments, at least one panel 120 of housing 112 forms a door that is selectively positionable between opened and closed positions. In addition, housing 112 includes a pass-through opening 121 defined by at least one panel 120 to provide access to electrical device 102 within interior space 122. In alternative embodiments, electrical system 100 includes any housing 112 that enables electrical system 100 to operate as described herein.

In addition, in the exemplary embodiment, restrictor 114 is coupled to electrical device 102. Electrical device 102 and restrictor 114 are positionable as an assembly relative to housing 112 between a first position (FIG. 1) in which electrical device 102 and restrictor 114 are positioned a first distance from frame 116 and a second position (FIG. 2) in which electrical device 102 and restrictor 114 are positioned a second distance from frame 116 less than the first distance. In the exemplary embodiment, electrical system 100 includes a draw-out mechanism 124 arranged to position electrical device 102 and restrictor 114 as an assembly between the first position and the second position. In alternative embodiments, electrical device 102 is positioned in any manner that enables electrical system 100 to operate as described herein.

Also, in the exemplary embodiment, restrictor 114 is arranged to provide a labyrinth path from the exterior of housing 112 into interior space 122. As used herein, labyrinth path refers to a path including at least two bends. Specifically, restrictor 114 includes a collar 126, a base 128, and a step 130. Base 128 has a bowl shape and couples to housing 112. Collar 126 circumscribes an open end of base 128 opposite housing 112. Step 130 extends between and connects collar 126 and base 128. In the exemplary embodiment, collar 126 has a width W1 greater than a width W2 of base 128. In alternative embodiments, electrical system 100 includes any restrictor 114 that enables electrical system 100 to operate as described herein.

In the exemplary embodiment, frame 116 includes an inner sidewall 127 that extends through opening 121 into interior space 122. Collar 126 is arranged to extend from electrical device 102 and along inner sidewall 127 of frame 116 such that collar 126 and inner sidewall 127 overlap within interior space 122. In the exemplary embodiment, inner sidewall 127 and collar 126 are substantially parallel. Inner sidewall 127 forms a cuboid shape having open ends. Inner sidewall 127 defines a width W3 less than width W1 and greater than width W2. Accordingly, collar 126 is spaced from inner sidewall 127 within interior space 122 to allow restrictor 114 to move relative to frame 116 and housing 112. In addition, step 130 extends substantially perpendicular to inner sidewall 127 and is spaced from inner sidewall 127 when restrictor 114 is coupled to housing 112. Accordingly, housing 112 and restrictor 114 inhibit objects, e.g., tools and wires having a diameter greater than 1 millimeter, from contacting electrical device 102 and/or other components of electrical system. In addition, restrictor 114 is arranged to provide a labyrinth path in each position of restrictor 114. As a result, ingress protection is maintained as restrictor 114 is moved relative to housing 112. In alternative embodiments, electrical system 100 includes any restrictor 114 that enables electrical system 100 to operate as described herein.

Moreover, in the exemplary embodiment, frame 116 is coupled to panel 120 of housing 112. Frame 116 defines at least one opening 132 for access to electrical device 102. Frame 116 is modular and accommodates different configurations and types of electrical devices 102. In addition, as described in more detail below, frame 116 is operatively coupleable to housing 112 in a plurality of different orientations. In alternative embodiments, case 104 includes any frame 116 that enables case 104 to operate as described herein.

In some embodiments, cover 118 is coupled to frame 116 and is positionable between a closed position (FIGS. 1 and 2) and an opened position (FIGS. 3-6). When cover 118 is in the opened position, an interior of case 104 is accessible to operators through openings 132 for inspection and maintenance of electrical device 102. When cover 118 is in the closed position, cover 118 covers openings 132 and inhibits dust and fluid ingress into interior space 122. In the exemplary embodiment, case 104 includes seals extending along frame 116 and is substantially watertight when cover 118 is in the closed position. For example, the seals extend along a perimeter of frame 116 between frame 116 and at least one panel 120 of housing 112. In addition, seals extend between cover 118 and frame 116 when cover 118 is in the closed position. In alternative embodiments, electrical device 102 includes any cover 118 that enables electrical device 102 to operate as described herein. In some embodiments, cover 118 is omitted.

Figure 3:
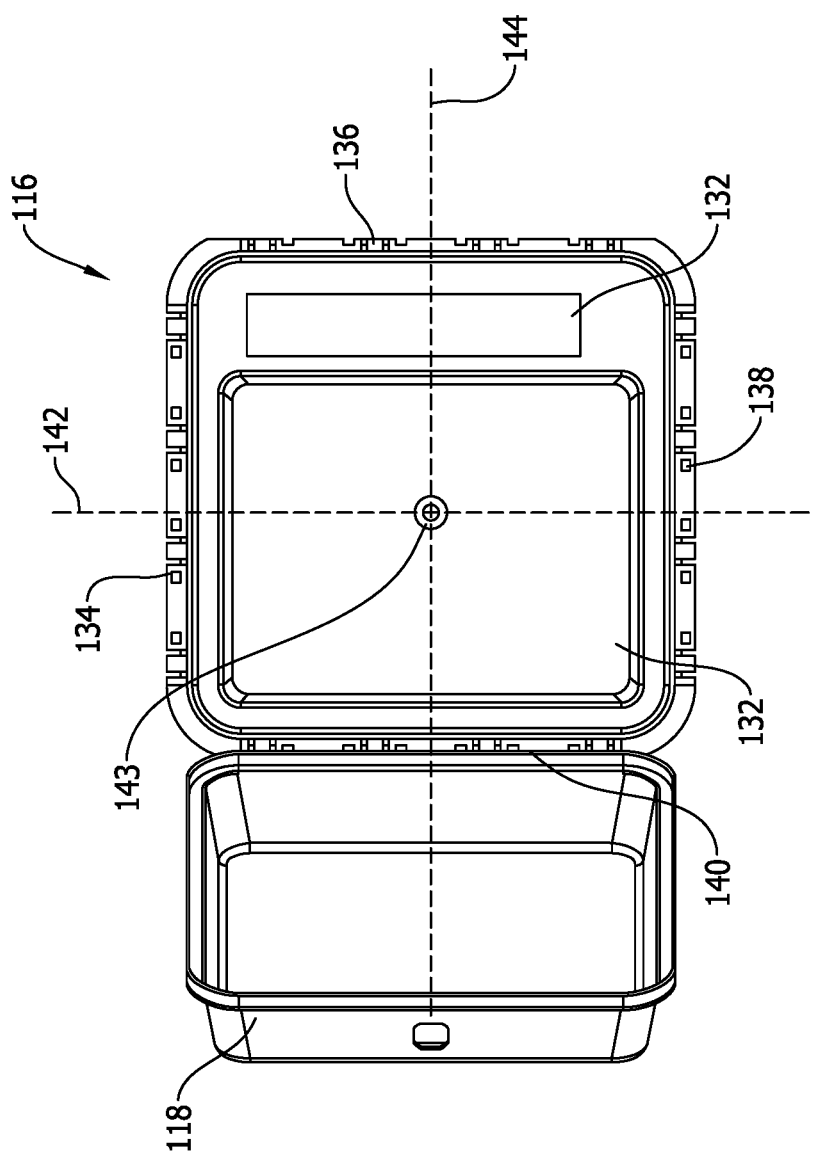
FIG. 3 is a front view of a cover and a frame of the case shown in FIGS. 1 and 2 in a first configuration.
Figure 4:
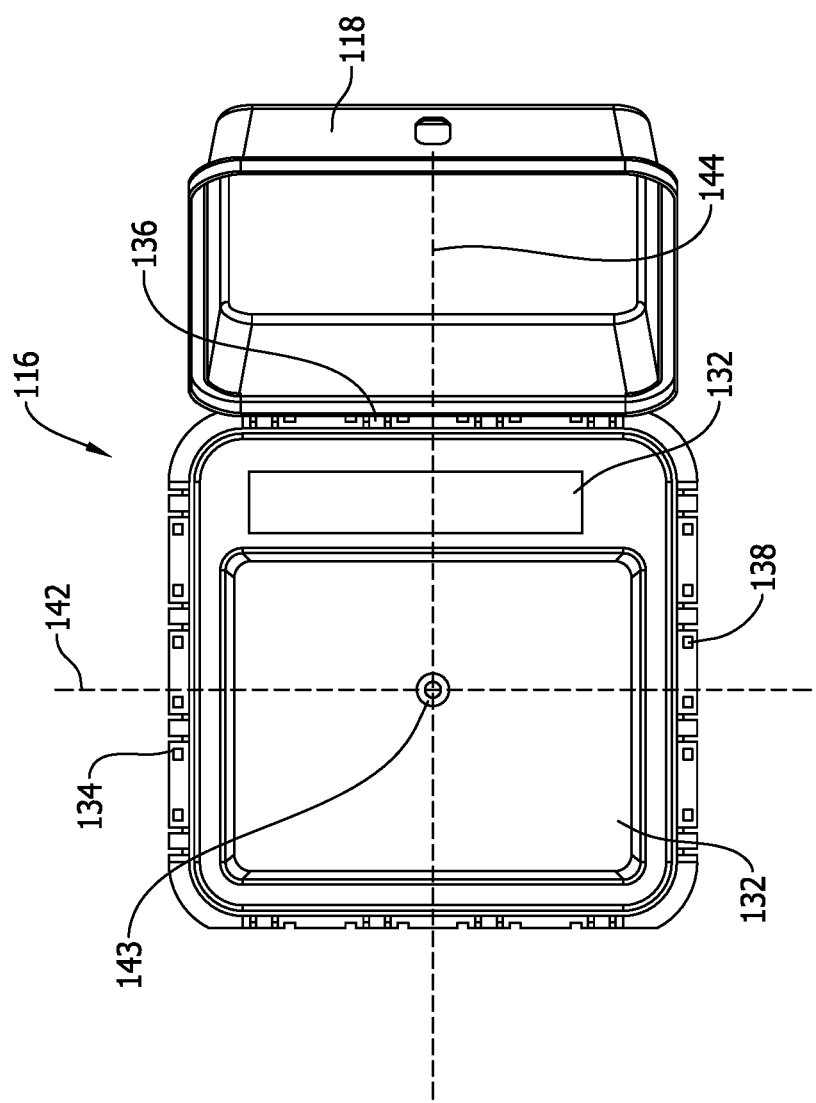
FIG. 4 is a front view of the cover and the frame of the case shown in FIGS. 1 and 2 in a second configuration.
Figure 5:
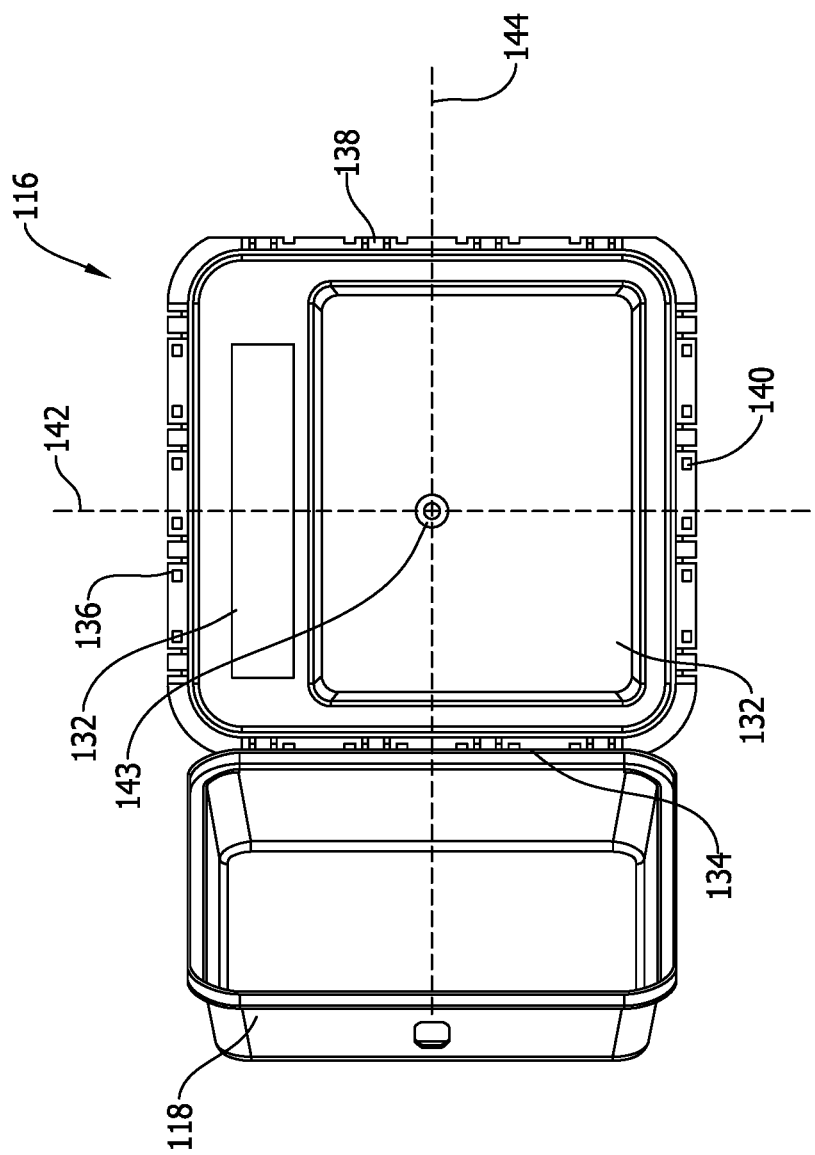
FIG. 5 is a front view of the cover and the frame of the case shown in FIGS. 1 and 2 in a third configuration.
Figure 6:
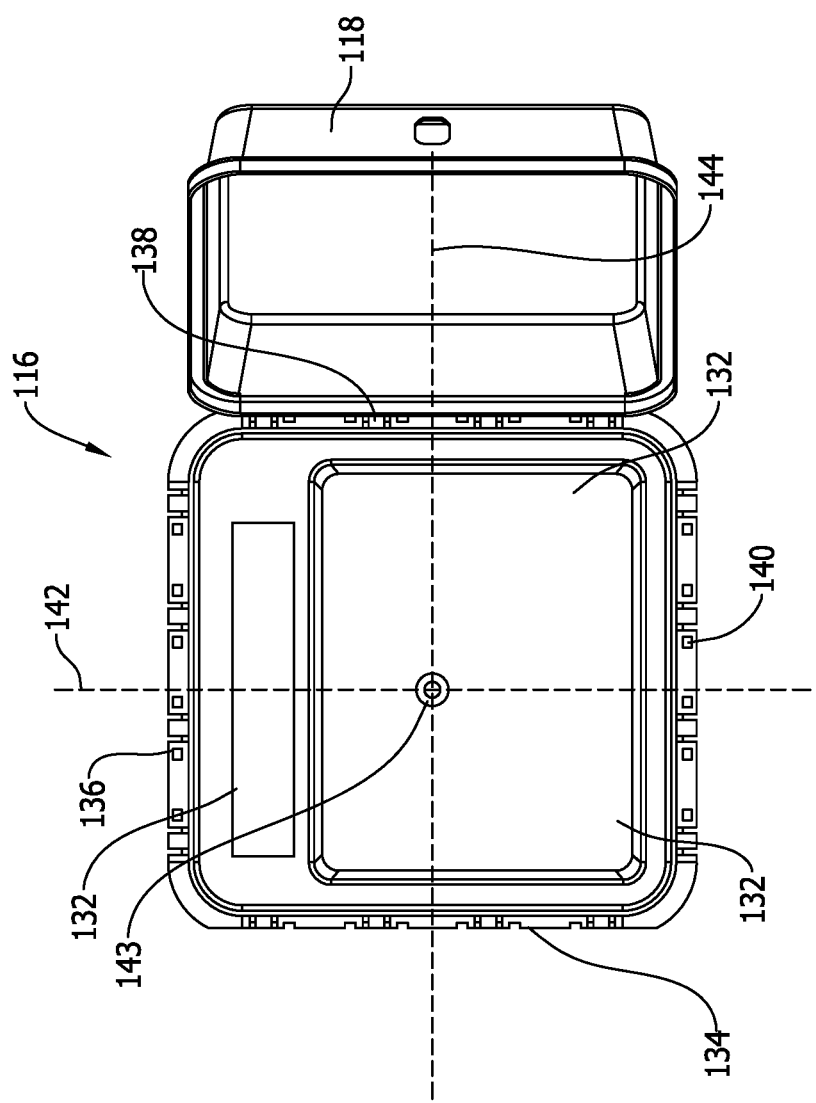
FIG. 6 is a front view of the cover and the frame of the case shown in FIGS. 1 and 2 in a fourth configuration.

FIGS. 3-6 are front views of cover 118 and frame 116 of case 104 in different configurations. For example, frame 116 is positionable in different orientations to allow case 104 to accommodate electrical devices 102 (shown in FIG. 1). In the exemplary embodiment, orientations of frame 116 are offset by 90° and frame 116 is positionable on case 104 in each orientation without adjusting housing 112. A first orientation of frame 116 is shown in FIGS. 3 and 4. A second orientation of frame 116 is shown in FIGS. 5 and 6. Cover 118 is coupleable to frame 116 in a plurality of configurations in each orientation of frame 116. For example, cover 118 is able to couple to frame 116 in a left-handed configuration (FIGS. 3 and 5) and a right-handed configuration (FIGS. 4 and 6) in each orientation of frame 116. In alternative embodiments, frame 116 and/or cover 118 have any orientations and configurations that enable case 104 to operate as described herein.

Also, in the exemplary embodiment, frame 116 includes a first side 134, a second side 136, a third side 138, and a fourth side 140 forming a perimeter of frame 116. First side 134 and third side 138 extend between and are perpendicular to second side 136 and fourth side 140. First side 134 is generally parallel to third side 138, and second side 136 is generally parallel to fourth side 140. Accordingly, frame 116 is generally square. Moreover, the perimeter of frame 116 is symmetric about axes 142, 144 extending through midpoints of first side 134, second side 136, third side 138, and fourth side 140. Also, frame 116 is rotationally symmetric about an axis 143 extending through the intersection of axes 142, 144, i.e., a center point of frame 116. As a result, the footprint of frame 116 remains the same as frame 116 is positioned in the different orientations. The shape of frame 116 allows frame 116 to couple to housing 112 (shown in FIGS. 1 and 2) in the plurality of different orientations without adjusting housing 112 and/or frame 116. In alternative embodiments, frame 116 has any shape that enables case 104 to function as described herein. For example, in some embodiments, frame 116 is at least partially circular, square, triangular, and/or any other suitable shape.

Figure 7:
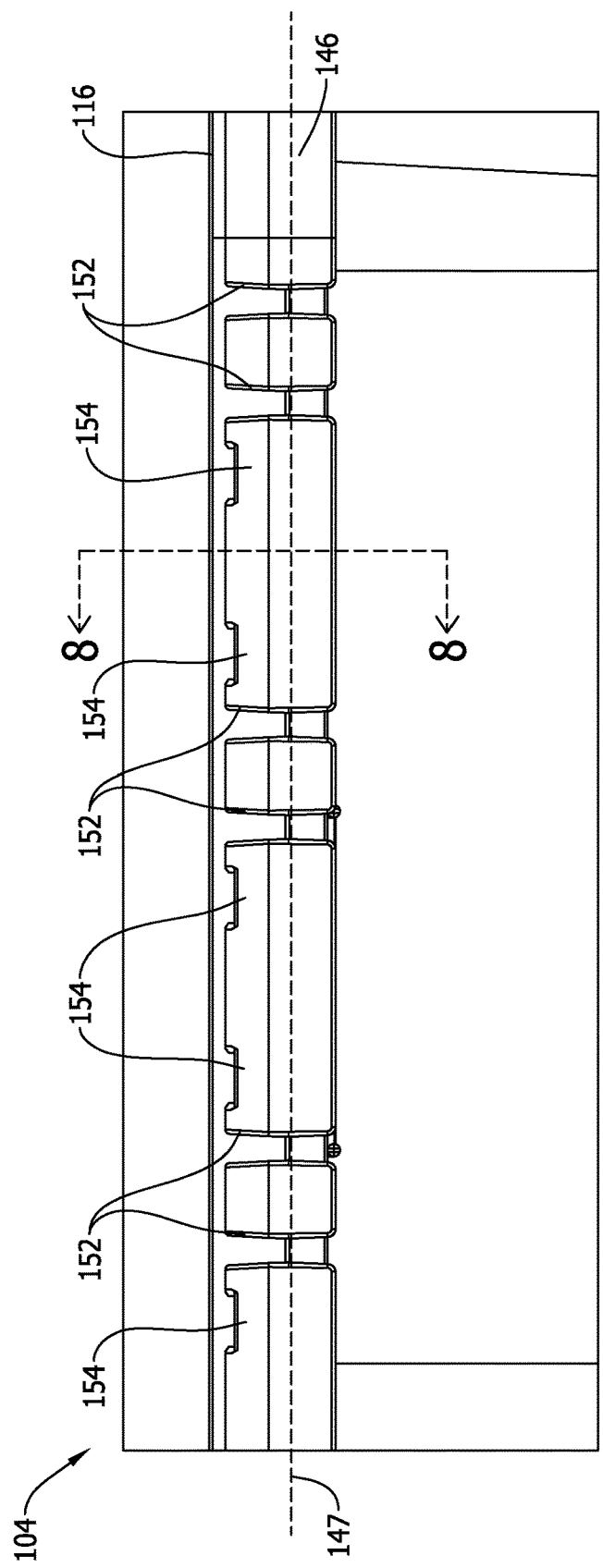
FIG. 7 is a side view of a portion of the frame shown in FIGS. 1-6 including an engagement feature.
Figure 8:
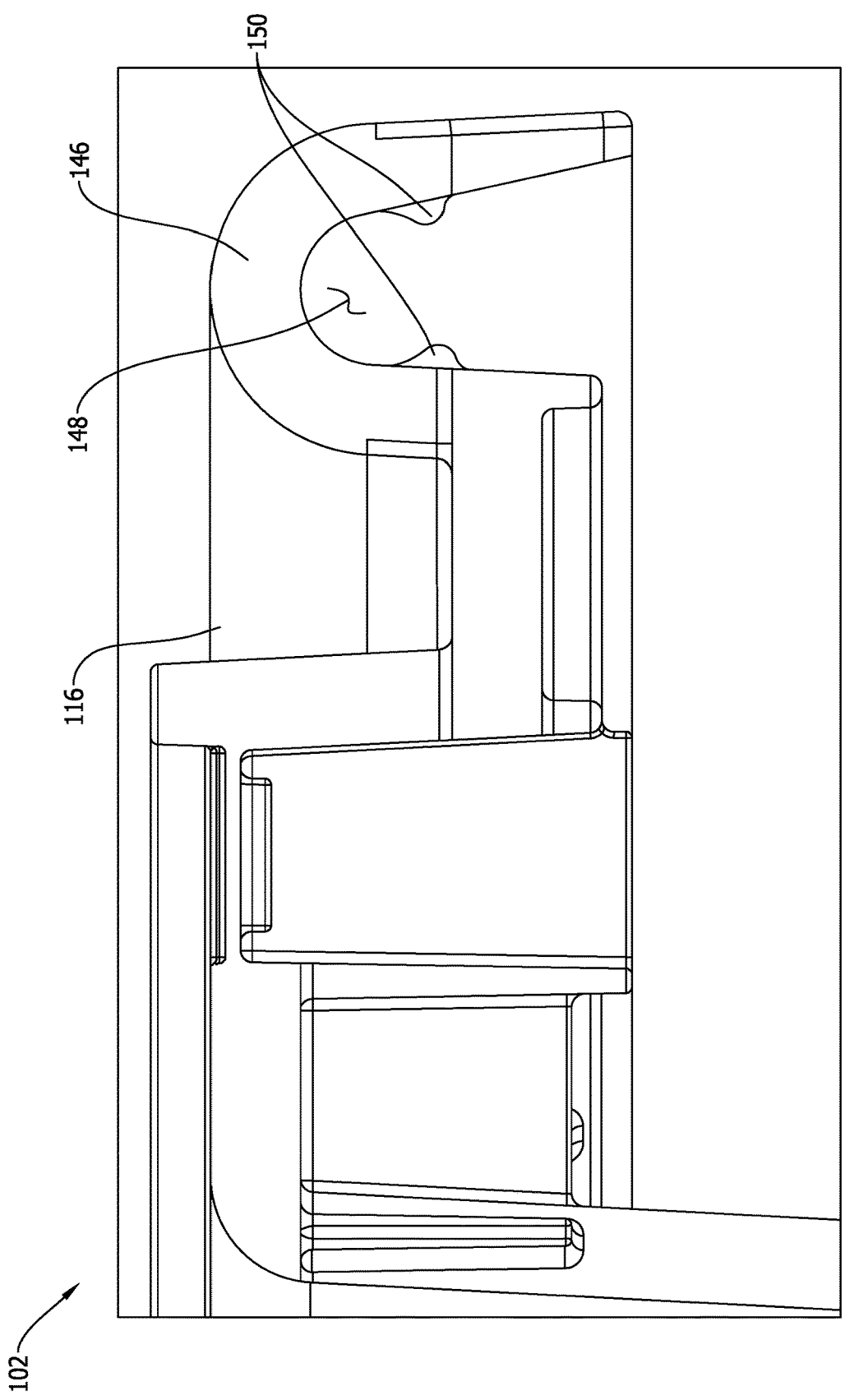
FIG. 8 is a sectional view of the engagement feature shown in FIG. 7 taken along line 8-8 in FIG. 7.

FIG. 7 is a side view of a portion of frame 116 including a sleeve 146. FIG. 8 is a sectional view of sleeve 146 taken along line 8-8 in FIG. 7. In the exemplary embodiment, first side 134, second side 136, third side 138, and fourth side 140 each include a sleeve, broadly an engagement feature, 146. Each sleeve 146 has a longitudinal axis 147 and defines a channel 148 extending along the respective side 134, 136, 138, 140. Each sleeve 146 includes a plurality of protrusions 150 that extend into channel 148 of the respective sleeve 146. In addition, each sleeve 146 defines a plurality of slots 152 and openings 154. Slots 152 extend perpendicular to longitudinal axis 147 and are elongate. Openings 154 extend along longitudinal axis 147 and are substantially square. In alternative embodiments, slots 152 and/or openings 154 have any shape that enables frame 116 to function as described herein. In the exemplary embodiment, openings 154 and slots 152 are arranged in pairs in an alternating pattern along sleeve 146. In alternative embodiments, frame 116 includes any engagement features that enable frame 116 to function as described herein.

Figure 9:
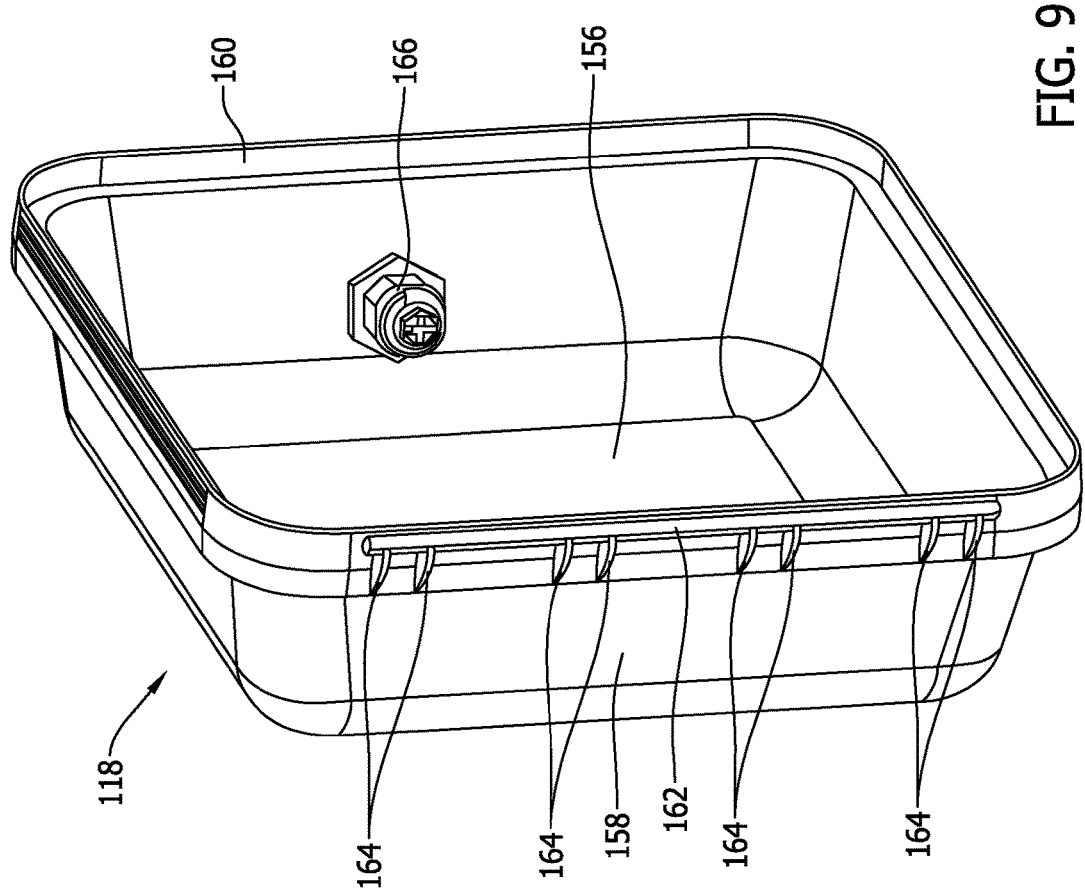
FIG. 9 is a perspective view of a cover for use with the case shown in FIGS. 1-8.
Figure 10:
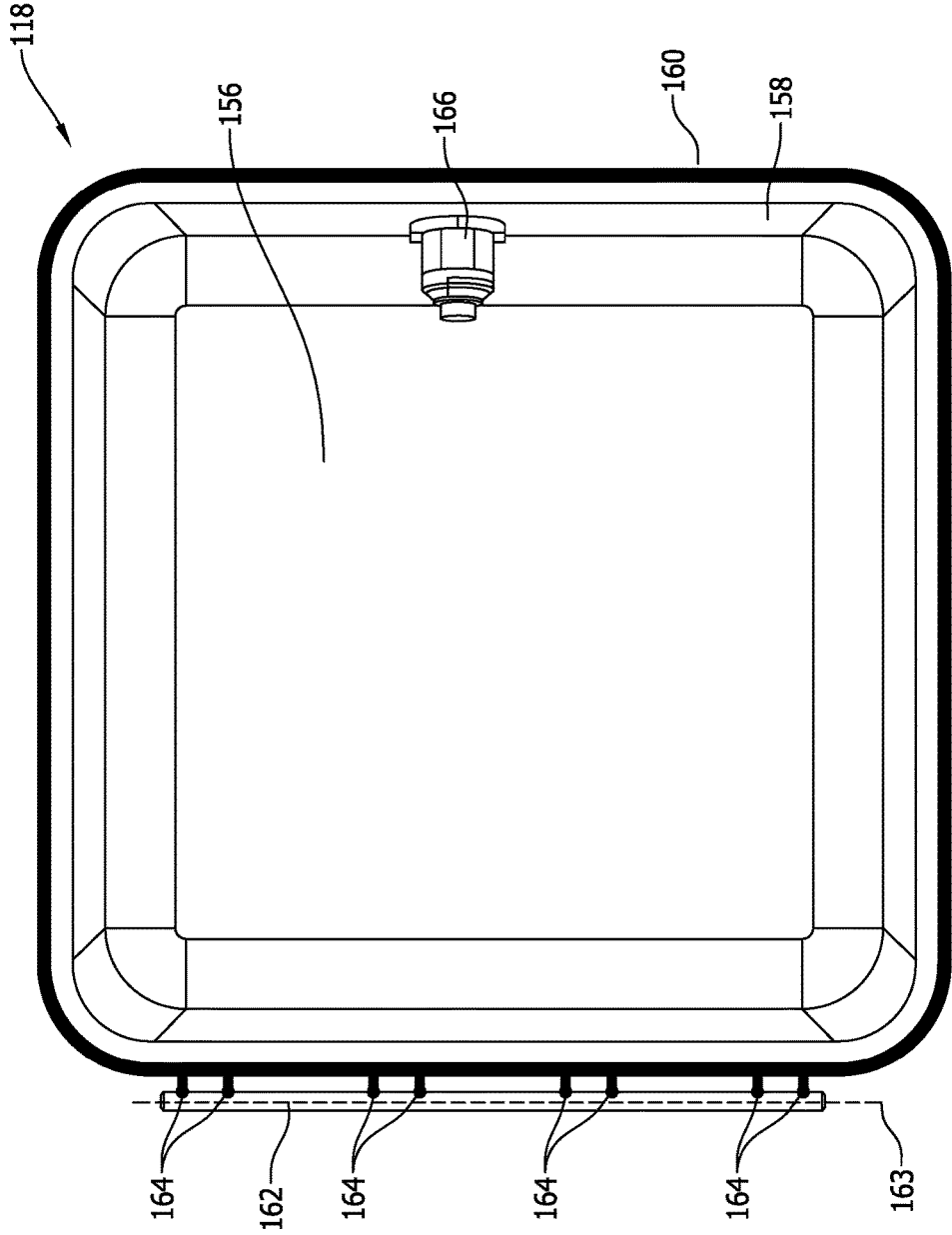
FIG. 10 is a rear view of the cover shown in FIG. 9.

FIG. 9 is a perspective view of cover 118 for use with frame 116 (shown in FIGS. 1-8). FIG. 10 is a rear view of cover 118. In the exemplary embodiment, cover 118 includes an endwall 156, a sidewall 158, and a lip 160. Sidewall 158 circumscribes and extends at an angle from endwall 156. Lip 160 extends from an end of sidewall 158 opposite endwall 156. Lip 160 is arranged to sealingly engage frame 116 when cover 118 is in a closed position. In some embodiments, cover 118 is at least partially translucent to allow interior space 122 (shown in FIG. 1) to be viewed from the exterior of housing 112 (shown in FIG. 1). In alternative embodiments, cover 118 has any configuration that enables cover 118 to function as described herein.

In reference to FIGS. 7-10, in the exemplary embodiment, cover 118 includes a hinge pin, broadly an engagement feature, 162, arranged to extend through channels 148. A plurality of supports 164 are disposed between lip 160 and hinge pin 162. Each support 164 has a first end coupled to lip 160 and a second opposing end coupled to hinge pin 162. Hinge pin 162 extends along at least one side of cover 118. Each sleeve 146 on first side 134, second side 136, third side 138, and fourth side 140 of frame 116 is arranged to engage hinge pin 162. Accordingly, frame 116 is arranged to receive cover 118 along any side 134, 136, 138, 140. When hinge pin 162 is positioned in channel 148, sleeve 146 and hinge pin 162 form a hinge between cover 118 and frame 116 and allow cover 118 to pivot about a rotational axis 163 extending through hinge pin 162 between the closed position and the opened position. In some embodiments, cover 118 includes a latch 166 to secure cover 118 in the closed position. In alternative embodiments, cover 118 has any configuration that enables cover 118 to operate as described herein.

Also, in the exemplary embodiment, sleeve 146 and protrusions 150 are configured to facilitate positioning hinge pin 162 in channel 148. For example, protrusions 150 deform from a neutral state to a deflected state to allow insertion of hinge pin 162 into channel 148. When hinge pin 162 is fully inserted, protrusions 150 return to the neutral state and retain hinge pin 162 in channel 148. Accordingly, sleeve 146 and hinge pin 162 provide a snap fit engagement. Sleeve 146 includes slots 152 that correspond to supports 164 and allow supports 164 to extend therethrough when hinge pin is positioned in channel 148. Accordingly, cover 118 and frame 116 simplify the assembly of case 104. For example, tools are not required to couple cover 118 to frame 116. To assemble cover 118 and frame 116, a user simply presses hinge pin 162 into channel 148 to obtain the snap fit engagement. In alternative embodiments, cover 118 is coupled to frame 116 in any manner that enables case 104 to function as described herein.

Figure 11:
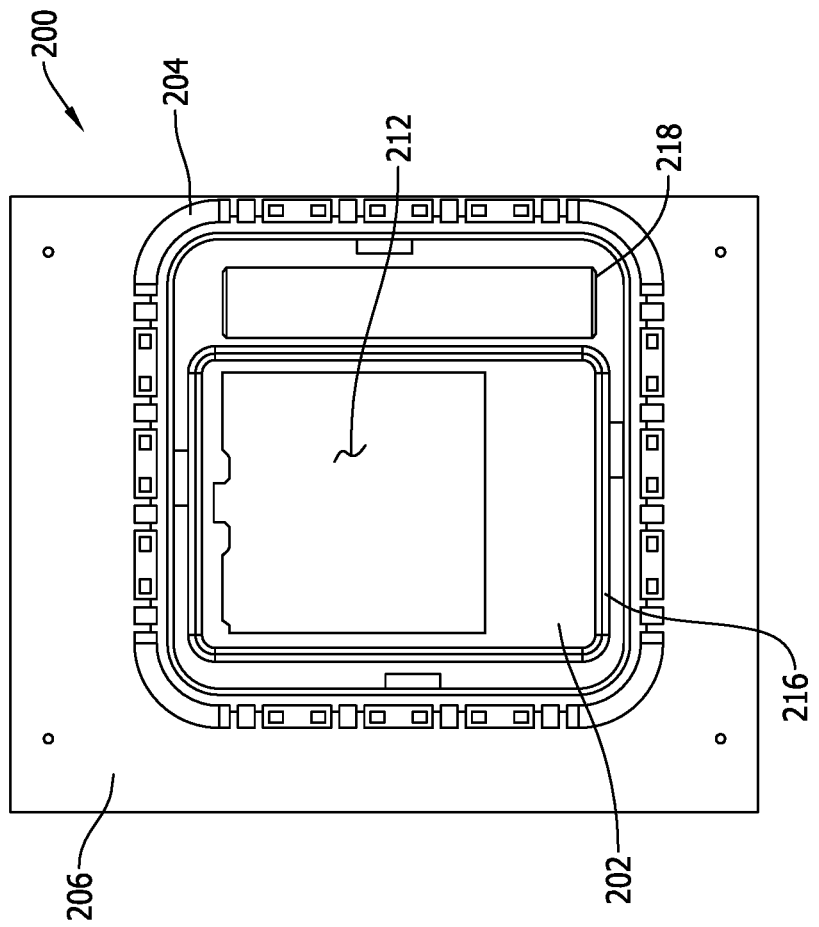
FIG. 11 is a front view of a portion another embodiment of an electrically insulative case for use with an electrical device.
Figure 12:
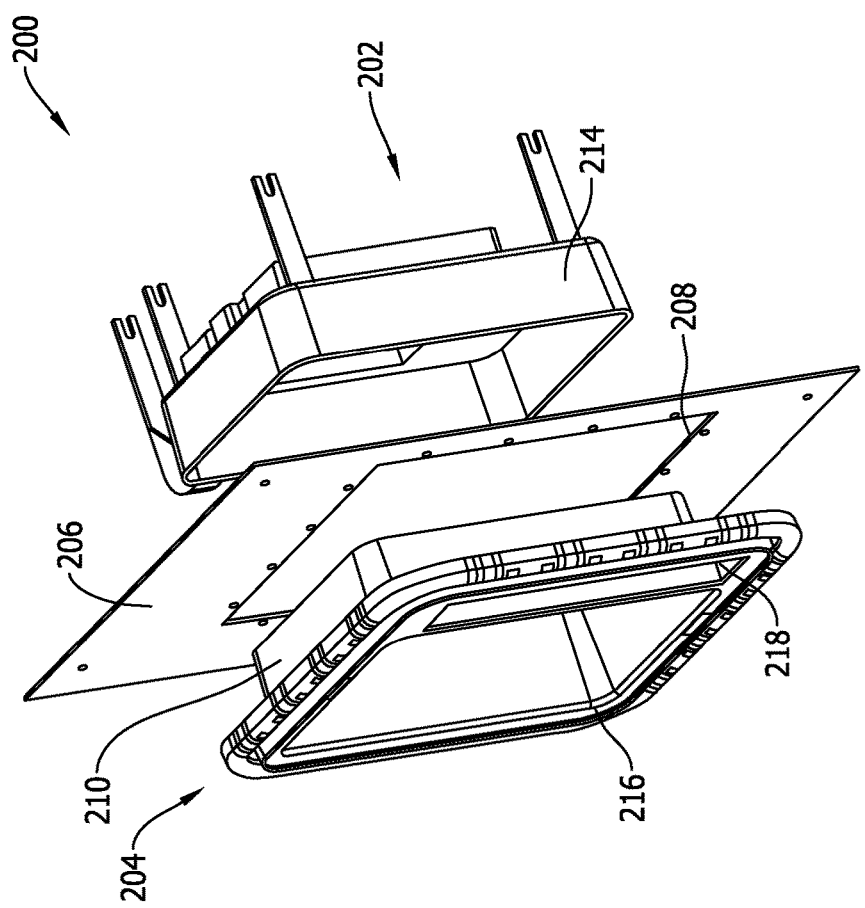
FIG. 12 is an exploded view of a portion of the case shown in FIG. 11.

FIG. 11 is a front view of a portion of another embodiment of an electrically insulative case 200 for use with electrical device 102 (shown in FIG. 1). FIG. 12 is an exploded view of a portion of case 200. Case 200 includes a restrictor 202, a frame 204, and a panel 206. Panel 206 defines an opening 208. In the exemplary embodiment, opening 208 is square. In addition, frame 204 is square and corresponds to the shape of opening 208. In alternative embodiments, frame 204 and opening 208 have any shape that enables case 200 to function as described herein.

In the exemplary embodiment, frame 204 includes a collar 210 that is arranged to extend through opening 208 and at least partially into an interior space 212 of case 200 when frame 204 is coupled to panel 206. In addition, collar 210 of frame 204 is received by a collar 214 of restrictor 202. In some embodiments, frame 204 is coupled to panel 206 by fasteners and/or any other suitable attachment means. In alternative embodiments, frame 204 is coupled to panel 206 in any manner that enables case 200 to function as described herein.

In the exemplary embodiment, frame 204 defines a first opening 216 and a second opening 218. First opening 216 is substantially rectangular and extends through a majority of frame 204. Second opening 218 is rectangular and extends along a side of first opening 216. First opening 216 is arranged to provide access to electrical device 102 (shown in FIG. 1). Second opening 218 is arranged to accommodate accessories of electrical system 100 (shown in FIG. 1). For example, in some embodiments, first opening 216 and/or second opening 218 accommodate components such as keylocks, rotary handles, operating mechanisms, switches, and toggles. In alternative embodiments, frame 204 includes any opening that enables case 200 to function as described herein. For example, in some embodiments, frame 204 includes three or more openings. In further embodiments, frame 204 includes a single opening.

Figure 13:
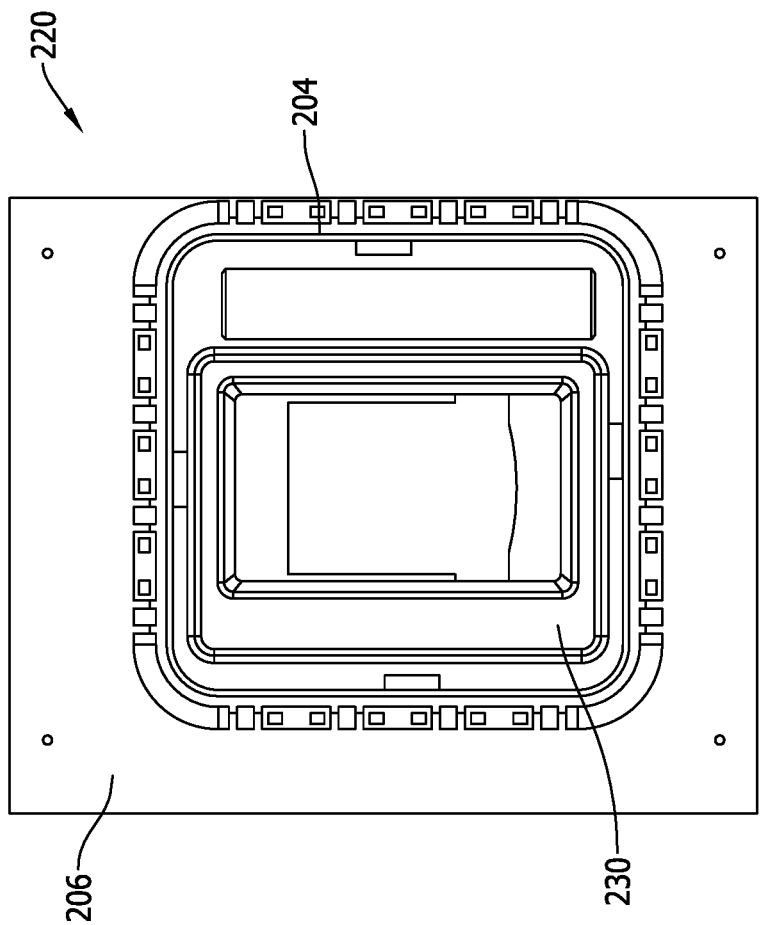
FIG. 13 is a front view of another embodiment of an electrically insulative case including the frame shown in FIGS. 11 and 12.
Figure 14:
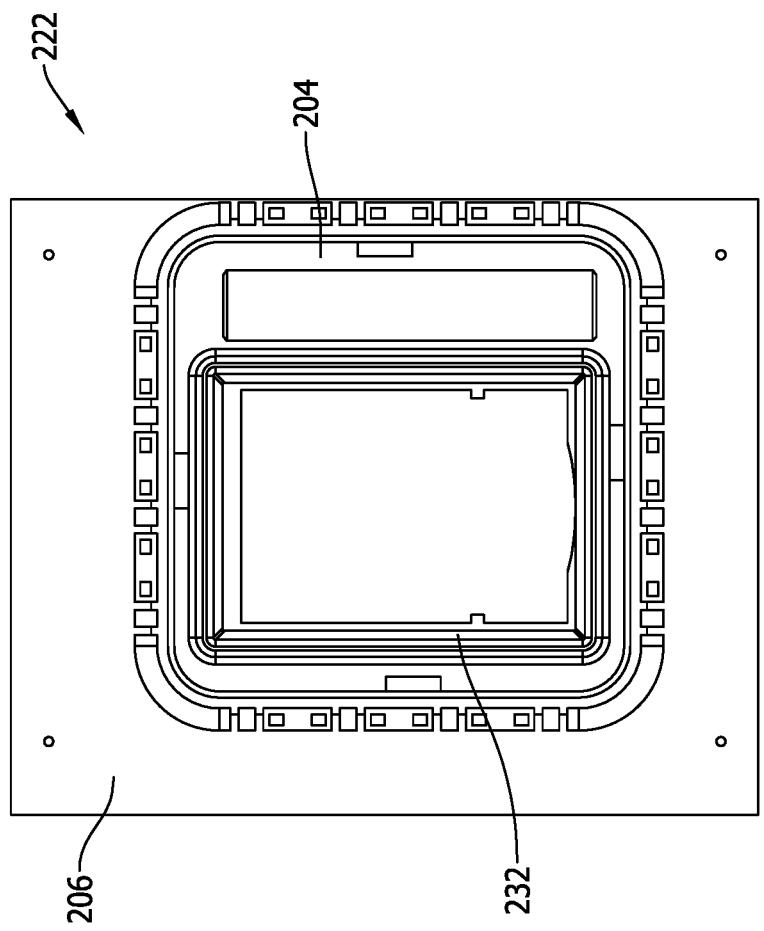
FIG. 14 is a front view of another embodiment of an electrically insulative case including the frame shown in FIGS. 11 and 12.
Figure 15:
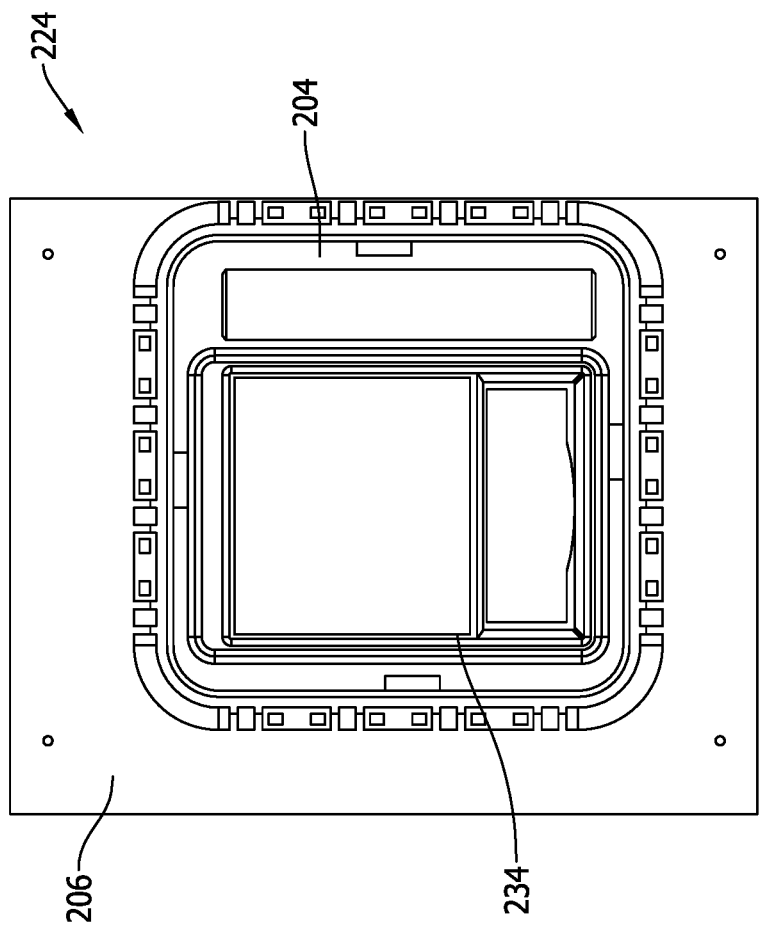
FIG. 15 is a front view of another embodiment of an electrically insulative case including the frame shown in FIGS. 11 and 12.
Figure 16:
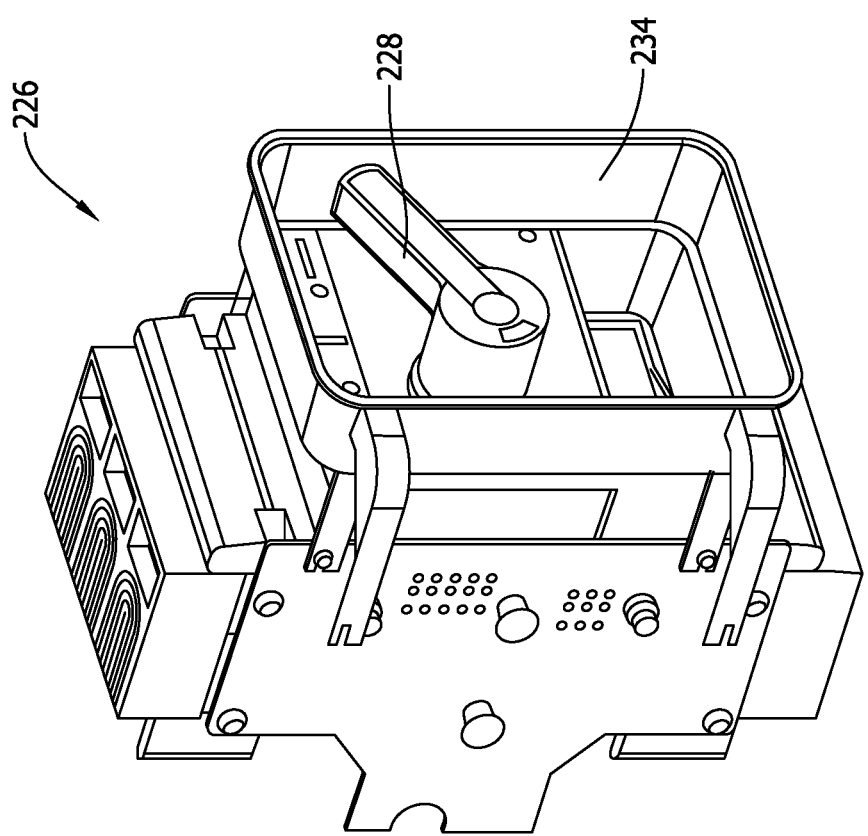
FIG. 16 is a perspective view of an electrical device coupled to a restrictor of the case shown in FIG. 15.

FIGS. 13-15 are front views of alternative embodiments of electrically insulative cases 220, 222, 224. FIG. 16 is a perspective view of an electrical device 226 coupled to a restrictor 234 of case 224. Cases 220, 222, 224 are similar to case 200 (shown in FIGS. 11 and 12) except each case 220, 222, 224 includes a restrictor 230, 232, 234 different from restrictor 202. Accordingly, each case 220, 222, 224 accommodates a different electrical device 226. However, each case 220, 222, 224 includes the same frame 204 because frame 204 is modular and accommodates different electrical devices 226. As a result, frame 204 reduces the amount of specialized parts required to accommodate different electrical devices 226 and reduces the time and cost required to assemble cases 220, 222, 224. In alternative embodiments, cases 220, 222, 224 include any restrictor that enables cases 220, 222, 224 to operate as described herein.

Also, in the exemplary embodiment, electrical device 226 is a circuit breaker and includes a rotary handle 228. Frame 204 is arranged to accommodate electrical device 226. For example, frame 204 is arranged to provide access to rotary handle 228. In alternative embodiments, frame 204 is used with any electrical device 226 that enables frame 204 to operate as described herein. For example, in some embodiments, frame 204 is used with electrical devices 226 including, without limitation, air circuit breakers, molded case circuit breakers, switches, miniature circuit breakers, and/or relays.

In reference to FIGS. 1-3, a method of manufacturing electrical system 100 includes positioning electrical device 102 within interior space 122 of housing 112 of electrically insulative case 104. The method also includes positioning frame 116 on housing 112. Frame 116 is rotationally symmetric about axis 143 of frame 116 and is coupleable to housing 112 in a plurality of orientations. The method further includes coupling frame 116 to housing 112 in an orientation of the plurality of orientations that corresponds to electrical device 102. For example, in some embodiments, frame 116 is positioned such that openings 132 align with electrical device 102 and/or accessories of electrical device 102. In addition, the method includes coupling restrictor 114 to electrical device 102. Restrictor 114 is arranged to extend adjacent to frame 116 and inhibit objects from contacting electrical device 102 when restrictor 114 is coupled to electrical device 102. Restrictor 114 is positioned adjacent housing 112 such that restrictor 114 forms a labyrinth from the exterior of housing 112 into interior space 122. In some embodiments, the method includes coupling cover 118 to frame 116 such that cover 118 is moveable between an opened position and a closed position. Cover 118 is coupleable to frame 116 in a plurality of configurations in each orientation of the plurality of orientations of frame 116. For each configuration, hinge pin 162 is positioned in channel 148 along a selected side 136, 134, 138, 140 such that the respective sleeve 146 engages hinge pin 162. When cover 118 is coupled to frame 116, cover 118 is pivotable about hinge pin 162 which extends along the respective side 136, 134, 138, 140.

The electrically insulative cases described above generally include a restrictor, a housing, and a frame. The housing is arranged to receive an electrical device within an interior space and defines at least one opening to provide access to the electrical device within the interior space. The electrical device is positionable relative to the housing to facilitate access to the electrical device. The restrictor is coupled to the electrical device and provides a labyrinth path into the interior space to inhibit objects from moving from an exterior of the housing into the interior space. The frame is positionable on the housing in a plurality of orientations. Moreover, in some embodiments, a cover is coupled to the frame and positionable to close the opening. The cover is coupled to the frame in a plurality of configurations for each orientation of the cover. As a result, the case increases the number of electrical devices that are accommodated by the case without changing parts. Furthermore, the case decreases the cost and time required to assemble electrical systems.

An exemplary technical effect of the methods, systems, and apparatus described herein includes at least one of: (a) reducing cost and time required to assemble electrically insulative cases for electrical devices; (b) increasing the possible configurations of an electrically insulative case; (c) providing an electrically insulative case that is adjustable by adding a cover to provide increased ingress protection; and (d) providing a modular frame that accommodates different configurations of one or more electrical devices.

Exemplary embodiments of electrical devices and methods of manufacturing electrical devices are described above in detail. The electrical devices and methods are not limited to the specific embodiments described herein but, rather, components of the electrical devices and/or operations of the methods may be utilized independently and separately from other components and/or operations described herein. Further, the described components and/or operations may also be defined in, or used in combination with, other systems, methods, and/or devices, and are not limited to practice with only the electrical devices and systems described herein.

The order of execution or performance of the operations in the embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrically insulative case for an electrical device, said electrically insulative case comprising:
   a housing defining an interior space, said housing arranged to receive the electrical device within the interior space;
   a frame operatively coupleable to said housing in a plurality of orientations, said frame defining at least one opening that provides access to the electrical device, wherein said frame includes an inner sidewall that extends into the interior space;
   a restrictor coupleable to the electrical device such that said restrictor extends from the electrical device and along a side surface of said inner sidewall of said frame, wherein said restrictor is arranged to inhibit objects from moving from an exterior of said housing into the interior space; and
   a cover moveable between an opened position and a closed position, wherein said frame includes a first side and a second side, and wherein said first side includes a first engagement feature coupleable to said cover and said second side includes a second engagement feature coupleable to said cover.

2. The electrically insulative case in accordance with claim 1, wherein said frame is rotationally symmetric about a center point of said frame.

3. The electrically insulative case in accordance with claim 1, wherein said frame further includes a third side and a fourth side, wherein said third side includes a third engagement feature coupleable to said cover and said fourth side includes a fourth engagement feature coupleable to said cover.

4. The electrically insulative case in accordance with claim 3, wherein said first engagement feature, said second engagement feature, said third engagement feature, and said fourth engagement feature each comprise a sleeve defining a channel.

5. The electrically insulative case in accordance with claim 4, wherein said cover comprises a hinge pin arranged to engage any of said sleeves of said first, second, third, and fourth engagement features to couple said cover to said frame, wherein said cover is pivotable about said hinge pin when said cover is coupled to said frame.

6. The electrically insulative case in accordance with claim 5, wherein said sleeves of said first, second, third, and fourth engagement features each include protrusions arranged to engage said hinge pin.

7. The electrically insulative case in accordance with claim 5, wherein said sleeves of said first, second, third, and fourth engagement features each define a plurality of slots.

8. The electrically insulative case in accordance with claim 7, wherein said cover further comprises supports coupled to said hinge pin, said supports extending through the plurality of slots of an associated sleeve when said hinge pin is positioned in the channel defined by said associated sleeve.

9. The electrically insulative case in accordance with claim 1, wherein said cover is at least partially translucent to allow the interior space to be viewed from an exterior of said housing.

10. The electrically insulative case in accordance with claim 1, wherein said housing and said restrictor are arranged to form a labyrinth path from an exterior of said housing into the interior space.

11. The electrically insulative case in accordance with claim 10, wherein said restrictor comprises a base, a collar, and a step extending between said base and said collar.

12. The electrically insulative case in accordance with claim 11, wherein said collar of said restrictor is arranged to extend along said inner sidewall of said frame.

13. The electrically insulative case in accordance with claim 1, further comprising at least one seal extending between said frame and said housing.

14. An electrical system comprising:
   an electrical device; and
   an electrically insulative case for the electrical device, said electrically insulative case comprising:
      a housing defining an interior space, said housing arranged to receive the electrical device within the interior space;
      a frame operatively coupleable to said housing in a plurality of orientations, said frame defining at least one opening that provides access to the electrical device, wherein said frame includes an inner sidewall that extends into the interior space;
      a restrictor coupleable to said electrical device such that said restrictor extends from said electrical device and along a side surface of said inner sidewall of said frame, wherein said restrictor is arranged to inhibit objects from moving from an exterior of said housing into the interior space; and
      a cover moveable between an opened position and a closed position, wherein said frame includes a first side and a second side, and wherein said first side includes a first engagement feature coupleable to said cover and said second side includes a second engagement feature coupleable to said cover.

15. The electrical system in accordance with claim 14, wherein said frame further includes a third side and a fourth side, wherein said first side, said second side, said third side, and said fourth side each include a sleeve arranged to engage said cover.

16. The electrical system in accordance with claim 15, wherein said cover comprises a hinge pin arranged to engage any of said sleeves of said first, second, third, and fourth sides to couple said cover to said frame, wherein said cover is pivotable about said hinge pin when said cover is coupled to said frame.

17. The electrical system in accordance with claim 14, wherein said housing and said restrictor are arranged to form a labyrinth path from an exterior of said housing into the interior space.

18. A method of manufacturing an electrical system including an electrical device and an electrically insulative case, said method comprising:
    positioning the electrical device within an interior space of a housing of the electrically insulative case;
    positioning a frame on the housing such that an inner sidewall of the frame extends into the interior space, the frame defining at least one opening to provide access to the electrical device, wherein the frame is operatively coupleable to the housing in a plurality of orientations;
    coupling the frame to the housing in an orientation that accommodates the electrical device, wherein the at least one opening is aligned with the electrical device;
    coupling a restrictor to the electrical device, wherein the restrictor extends from the electrical device and along a side surface of the inner sidewall of the frame and inhibits objects from moving form an exterior of the housing into the interior space; and
    coupling a cover to a first engagement feature of the frame and to a second engagement feature of the frame, the cover being moveable between an opened position and a closed position.

19. The method in accordance with claim 18, wherein coupling a cover to the frame comprises engaging a hinge pin on the cover with a sleeve on the frame that defines a channel.

20. The method in accordance with claim 18, further comprising positioning the restrictor adjacent the housing such that the restrictor forms a labyrinth path from an exterior of the housing into the interior space.

21. The method in accordance with claim 20, wherein the restrictor includes a base, a collar, and a step, and wherein the method further comprises positioning the restrictor adjacent the frame such that the collar of the restrictor extends along the inner sidewall of the frame.

* * * * *